US006771556B2

(12) United States Patent
Aden

(10) Patent No.: US 6,771,556 B2
(45) Date of Patent: Aug. 3, 2004

(54) SINGLE PORT RANDOM ACCESS MEMORY EQUIPPED WITH A RELIEF MODULE TO OPERATE AS A DUAL PORT SHARED MEMORY

(75) Inventor: Charles Melvin Aden, Berkeley, CA (US)

(73) Assignee: Lucent Technologies Inc., Murray Hill, NJ (US)

( * ) Notice: Subject to any disclaimer, the term of this patent is extended or adjusted under 35 U.S.C. 154(b) by 317 days.

(21) Appl. No.: 10/097,583

(22) Filed: Mar. 13, 2002

(65) Prior Publication Data

US 2003/0177299 A1 Sep. 18, 2003

(51) Int. Cl.[7] ........................ G06F 13/16; G06F 13/37
(52) U.S. Cl. ...................... 365/230.04; 365/230.03; 365/230.05; 711/149; 711/5; 711/2; 710/42; 710/43; 710/111
(58) Field of Search ................. 365/230.01, 230.03, 365/230.04, 230.05; 710/3, 36, 38, 42, 43, 111, 115; 711/1, 2, 4, 5, 149

(56) References Cited

U.S. PATENT DOCUMENTS

| 4,509,115 A | | 4/1985 | Manton et al. | |
|---|---|---|---|---|
| 4,604,682 A | | 8/1986 | Schwan et al. | |
| 4,652,993 A | * | 3/1987 | Scheuneman et al. | 711/151 |
| 5,001,671 A | * | 3/1991 | Koo et al. | 365/230.05 |
| 5,226,010 A | | 7/1993 | Glider et al. | |
| 5,371,877 A | * | 12/1994 | Drako et al. | 711/109 |
| 5,465,344 A | | 11/1995 | Hirai et al. | |
| 5,615,355 A | * | 3/1997 | Wagner | 711/167 |
| 5,664,140 A | | 9/1997 | Klein | |
| 5,673,415 A | | 9/1997 | Nguyen et al. | |
| 5,699,530 A | * | 12/1997 | Rust et al. | 711/150 |
| 6,078,336 A | * | 6/2000 | Reynolds | 345/558 |
| 6,150,679 A | * | 11/2000 | Reynolds | 257/213 |

FOREIGN PATENT DOCUMENTS

| DE | 3137292 A1 | * | 5/1982 |
|---|---|---|---|
| JP | 06052328 A | * | 2/1994 |

* cited by examiner

Primary Examiner—B. James Peikari

(57) ABSTRACT

The present relief module equipped random access memory avoids the need for enforced idle cycles for the processors, thereby enabling the State Machine to operate at its maximum speed. This relief module equipped random access memory also enables the Central Processing Unit to access the data in the single-port Random Access Memory as required to read and write the data contained therein. This is accomplished by the addition of a single-port Random Access Memory module to the plurality of Random Access Memory modules that are typically specified for a particular application. The extra Random Access Memory module alternates its output with each of the others of the plurality of Random Access Memory modules, on a sequential basis, thereby providing effectively extra clock cycles for each Random Access Memory module.

6 Claims, 4 Drawing Sheets

SINGLE PORT RANDOM ACCESS MEMORY EQUIPPED WITH A RELIEF MODULE TO OPERATE AS A DUAL PORT SHARED MEMORY

FIELD OF THE INVENTION

This invention relates to central processor units and, in particular, to the use of a single-port Random Access Memory (RAM) that is shared between the Central Processing Unit and a State Machine.

PROBLEM

It is a problem in the field of Central Processing Units to balance the cost of memory with the speed of data read/write operations and the ability for multiple processors to access the same data that is stored in the memory. Traditionally, a single-port Random Access Memory is used in a Central Processing Unit environment due to the low cost of such devices when compared with a dual-port Random Access Memory. In addition, the dual-port Random Access Memory requires more pins and consumes more power than the comparable single-port Random Access Memory. However, it is frequently necessary to share the data stored in the single-port Random Access Memory between the Central Processing Unit and a State Machine. The State Machine typically requires a continuous stream of data from the Random Access Memory while the Central Processing Unit read and writes data in the Random Access Memory on a more irregular basis. Therefore, there is a significant impetus to adapt a single-port Random Access Memory for concurrent use by two processing elements.

This is traditionally accomplished by running the single-port Random Access Memory at a higher clock rate than is required by the State Machine and then using the resultant extra clock times for the Central Processing Unit to access the single-port Random Access Memory. The State Machine typically requires a continuous stream of data, read from consecutive addresses, while operating at top speed. When the single-port Random Access Memory can operate at double the speed required by the State Machine, then there is an adequate level of access to the single-port Random Access Memory for the Central Processing Unit. Where the difference between the maximum clock rate of the single-port Random Access Memory and the operating rate of the State Machine is less than the needs of the Central Processing Unit, then this configuration may fail to deliver the required performance.

There have been a number of attempts to address this problem, but they require precise clock synchronization and/or forcing the State Machine into an idle state during Central Processing Unit memory accesses to create available clock cycles for the Central Processing Unit, thereby sharing the performance degradation between the State Machine and the Central Processing Unit.

SOLUTION

The above-described problems are solved and a technical advance achieved in the art by the present single-port random access memory equipped with a relief module to operate as a dual-port shared memory ("relief module equipped random access memory") which avoids the need for enforced idle cycles for the processors, thereby enabling the State Machine to operate at its maximum speed. This relief module equipped random access memory also enables the Central Processing Unit to access the data in the single-port Random Access Memory as required to read and write the data contained therein. This is accomplished by the addition of one or more single-port Random Access Memory modules to the plurality of Random Access Memory modules that are typically specified for a particular application. The extra Random Access Memory module alternates its output with each of the others of the plurality of Random Access Memory modules, on a sequential basis, thereby providing effectively extra clock cycles for each Random Access Memory module. As a result, the shared memory system improves the memory access performance of both the Central Processing Unit and the State Machine.

This circuitry also renders the hardware configuration of Random Access Memory modules with the associated relief Random Access Memory module transparent to the software that executes on the Central Processing Unit. This is due to the fact that both the Central processing Unit and the State Machine perform the same memory address substitutions so the memory accesses are synchronized with respect to the physical memory addresses.

DETAILED DESCRIPTION

Prior Art Dual-Port Random Access Memory Configuration

Figure 1:
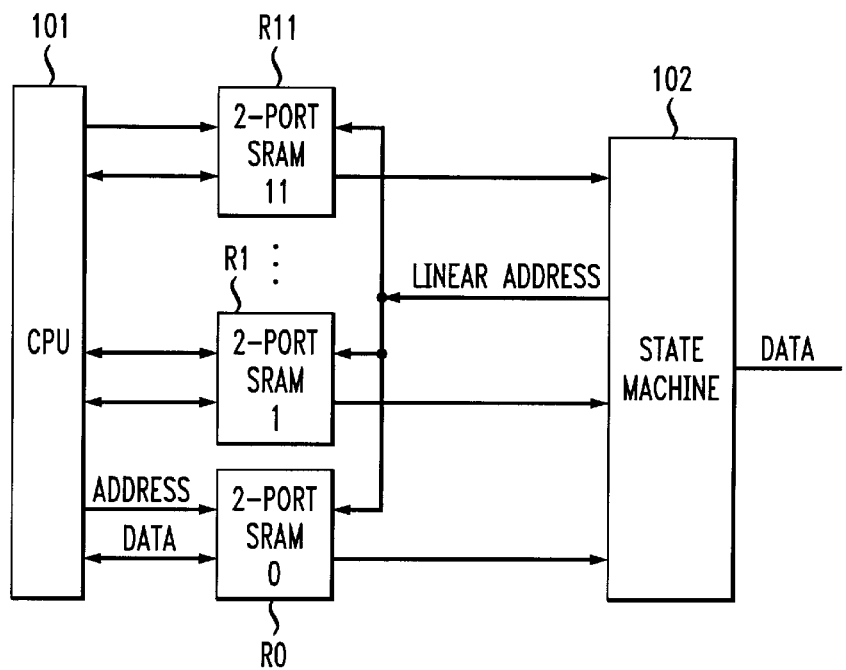
FIG. 1 illustrates in block diagram form the typical prior art dual-port Random Access Memory as used in a Central Processor Unit environment.

In the prior art, as illustrated in the circuit of FIG. 1, a plurality of dual-port Random Access Memories RAM0–RAM11 are used to implement the memory space for the processing elements of a system. Each dual-port Random Access Memory has a first port that is used by the Central Processing Unit 101 to read and write data in the Random Access Memory 100. Another processor, such as State Machine 102, is connected to a second port of the Random Access Memory 100 to read and write data in the Random Access Memory 100. However, the dual-port Random Access Memory is significantly greater in cost than a comparable capacity single-port Random Access Memory. In addition, the dual-port Random Access Memory requires more pins and consumes more power than the comparable single-port Random Access Memory. Therefore, there is a significant impetus to adapt a single-port Random Access Memory for use by two processing elements rather than use the dual-port Random Access Memory.

Prior Art Single-Port Random Access Memory Configuration

Figure 2:
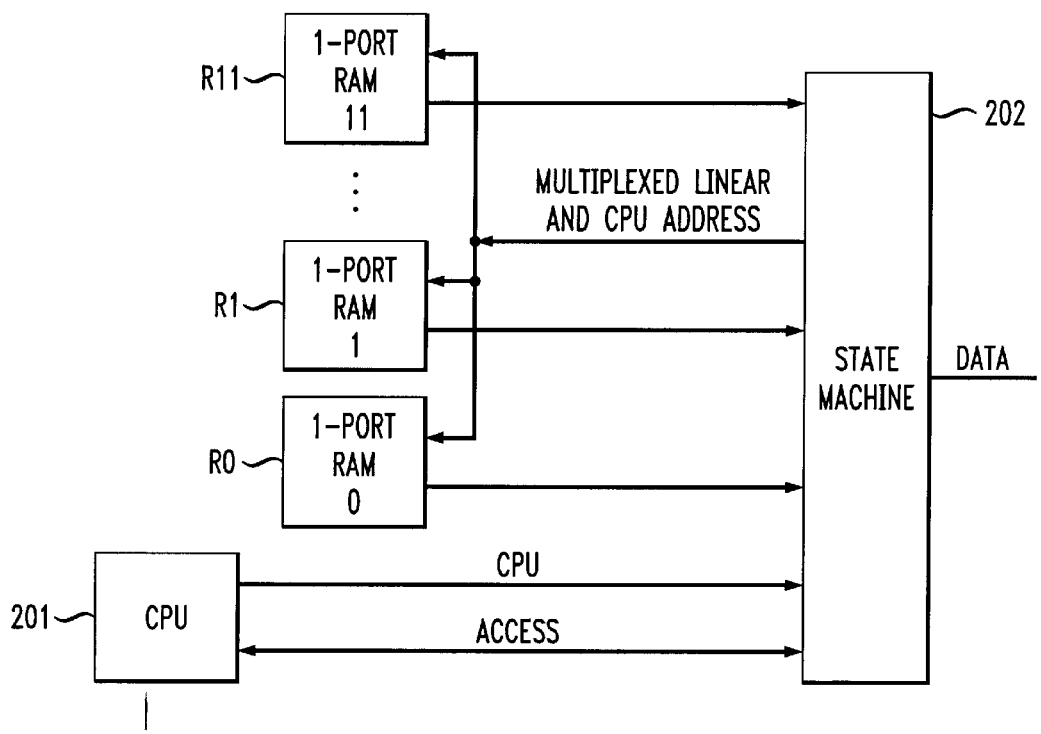
FIG. 2 illustrates in block diagram form the typical prior art single-port Random Access Memory as used in a Central Processor Unit environment.

FIG. 2 illustrates an adaptation where a single-port Random Access Memory 200 has its data, address and clock leads connected to a State Machine 202. The State Machine 202 is also connected to the Central Processing Unit 201. The State Machine 202 functions as the single-port Random Access Memory 200 interface and implements a virtual dual-port interface by enabling the Central Processing Unit 201 to access the single-port Random Access Memory 200 in a time-interleaved manner with the operation of the State Machine 201. This is accomplished by running the single-port Random Access Memory 200 at a higher clock rate that is required by the State Machine 202 and then using the resultant idle clock times for the Central Processing Unit 201 to access the single-port Random Access Memory 200. When the single-port Random Access Memory 200 can operate at double the speed required by the State Machine 202, then there is an adequate level of access to the single-port Random Access Memory 200 for the Central Processing Unit 201. Where the difference between the maximum clock rate of the single-port Random Access Memory and the operating rate of the State Machine 202 is less than the needs of the Central Processing Unit 201, then this configuration fails to deliver the required performance.

There have been a number of attempts to address this problem, but they require precise clock synchronization or forcing the State Machine into an idle state during Central Processing Unit memory accesses, thereby sharing the performance degradation between the State Machine 202 and the Central Processing Unit 201.

Present Single-Port Random Access Memory Configuration

Figure 3:
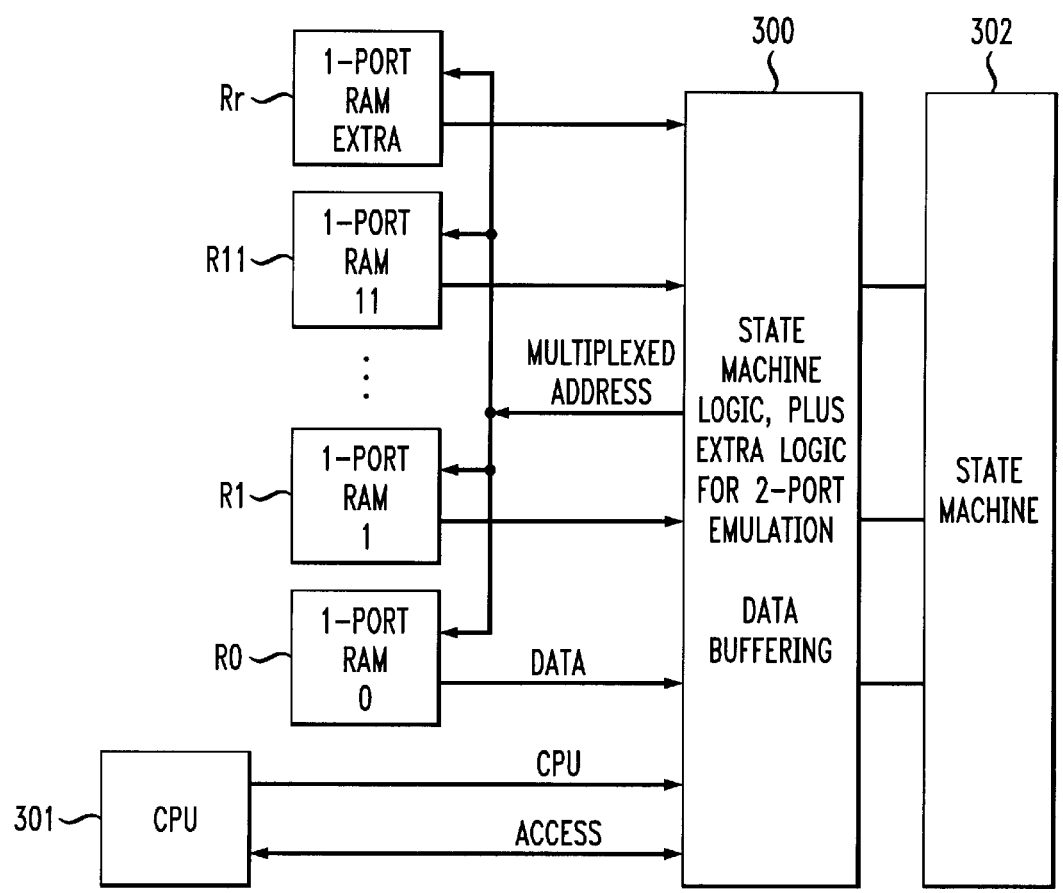
FIG. 3 illustrates in block diagram form the present relief module equipped random access memory as used in a Central Processor Unit environment.

The present relief module equipped random access memory is illustrated in FIG. 3. The present relief module equipped random access memory 300 avoids the need for enforced idle cycles for the processors, thereby enabling the State Machine 302 to operate at its maximum speed. This architecture also enables the Central Processing Unit 301 to access the data in the single-port Random Access Memory as required to read and write the data contained therein. This is accomplished by the addition of a single-port Random Access Memory module Rr to the plurality of Random Access Memory modules R0–R11 that are typically specified for a particular application. The extra Random Access Memory module Rr alternates its output with each of the others of the plurality of Random Access Memory modules R0–R11, on a sequential basis, thereby providing effectively extra clock cycles for each Random Access Memory module R0–R11. In the present example, twelve Random Access Memory modules R0–R11 are used as the memory, with an additional Random Access Memory module Rr being provided as the relief. The number of Random Access Memory modules is typically determined by the requirements of the State Machine 202 and the use of twelve Random Access Memory modules R0–R11 herein is simply to illustrate the operation of the present relief module equipped random access memory and is not intended to limit the scope or application of this concept.

The State Machine 302 and the Central Processing Unit 301 are connected to the relief module equipped random access memory 300 which includes the Random Access Memory modules R0–R11 and additional logic to emulate a dual-port Random Access Memory for the Central Processing Unit 301. The Central Processing Unit 301 requires several clock cycles for bus turn-arounds and logic delays to access one word stored in the Random Access Memory. In the present example, eight clock cycles are used to illustrate the operation of this system. When this relief time is rotated through all twelve Random Access Memory modules R0–R11, in addition to the relief Random Access Memory module Rr, the total number of clock cycles required for relief time is 13 modules*8 clock cycles per module=104 clock cycles. In order to simplify the address logic needed to manage this operation, 128 clock cycles are selected to be the rotating pattern. Thus, when the Central Processing Unit 301 selects a particular Random Access Memory module for access, it must wait until the rotating pattern relieves that Random Access Memory module. Given an example clock frequency of 156 MHz, the maximum latency to access a selected Random Access Memory module is 128 clock cycles*$\frac{1}{156}$ MHz=0.8 $\mu$Seconds.

Memory Module Substitution Pattern

Figure 4:
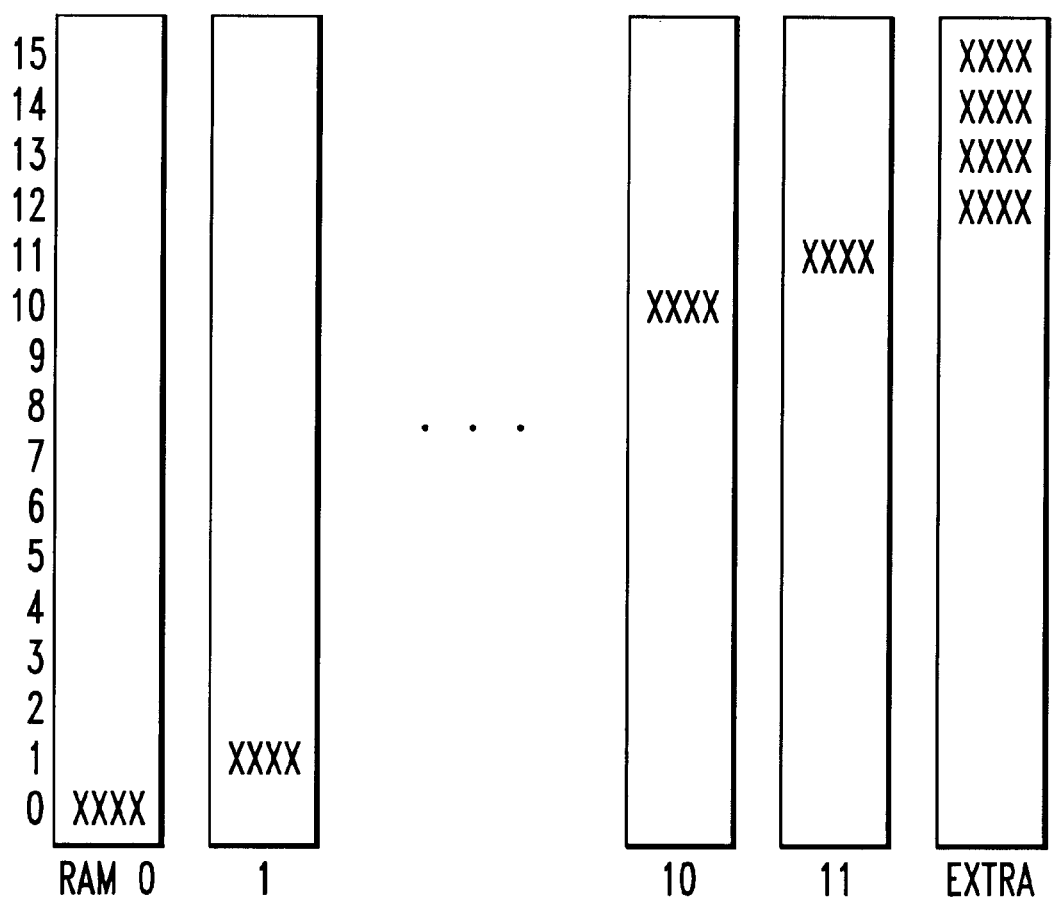
FIG. 4 illustrates the substitution pattern that is used to rotate the relief Random Access Memory module among the original Random Access Memory modules in the present relief module equipped random access memory.

FIG. 4 illustrates the substitution pattern that is used to rotate the relief Random Access Memory module Rr among the original twelve Random Access Memory modules R0–R11 in the present relief module equipped random access memory. Every eight clock cycles the pattern advances to the next Random Access Memory module R0–R11 at a higher memory address, so that all memory addresses increase linearly over time. As an example, during the first eight clock cycles of the 128 clock cycle repeating pattern, the output data from the relief Random Access Memory module Rr substitutes for Random Access Memory module R0. During this time period of eight clock cycles, the Random Access Memory module R0 can be written or read at any random address by the Central Processing Unit 301. During the next eight clock cycles of the 128 clock cycle repeating pattern, the relief Random Access Memory module Rr substitutes for Random Access Memory module R1. During this time period of eight clock cycles, the Random Access Memory module R1 can be written or read at any random address by the Central Processing Unit 301. This process continues until the twelfth Random Access Memory module R11 is accessed, then there is a set of four additional eight clock cycles of the 128 clock cycle repeating pattern, where the output data from the relief Random Access Memory module Rr can be accessed by the Central Processing Unit 301. The repeating pattern is then reinitiated and the repeat pattern begins with Random Access Memory module R0.

Thus, at any point in time, the Central Processing Unit 301 has uninterrupted access to one of the Random Access Memory modules R0–R11, Rr to read and write data therein while the State Machine concurrently has uninterrupted access to the remaining Random Access Memory modules. The particular Random Access Memory module available to the Central Processing Unit 301 at any point in time is determined by the 128 clock cycle repeating pattern.

Memory Module Substitution Control Circuit

Figure 5:
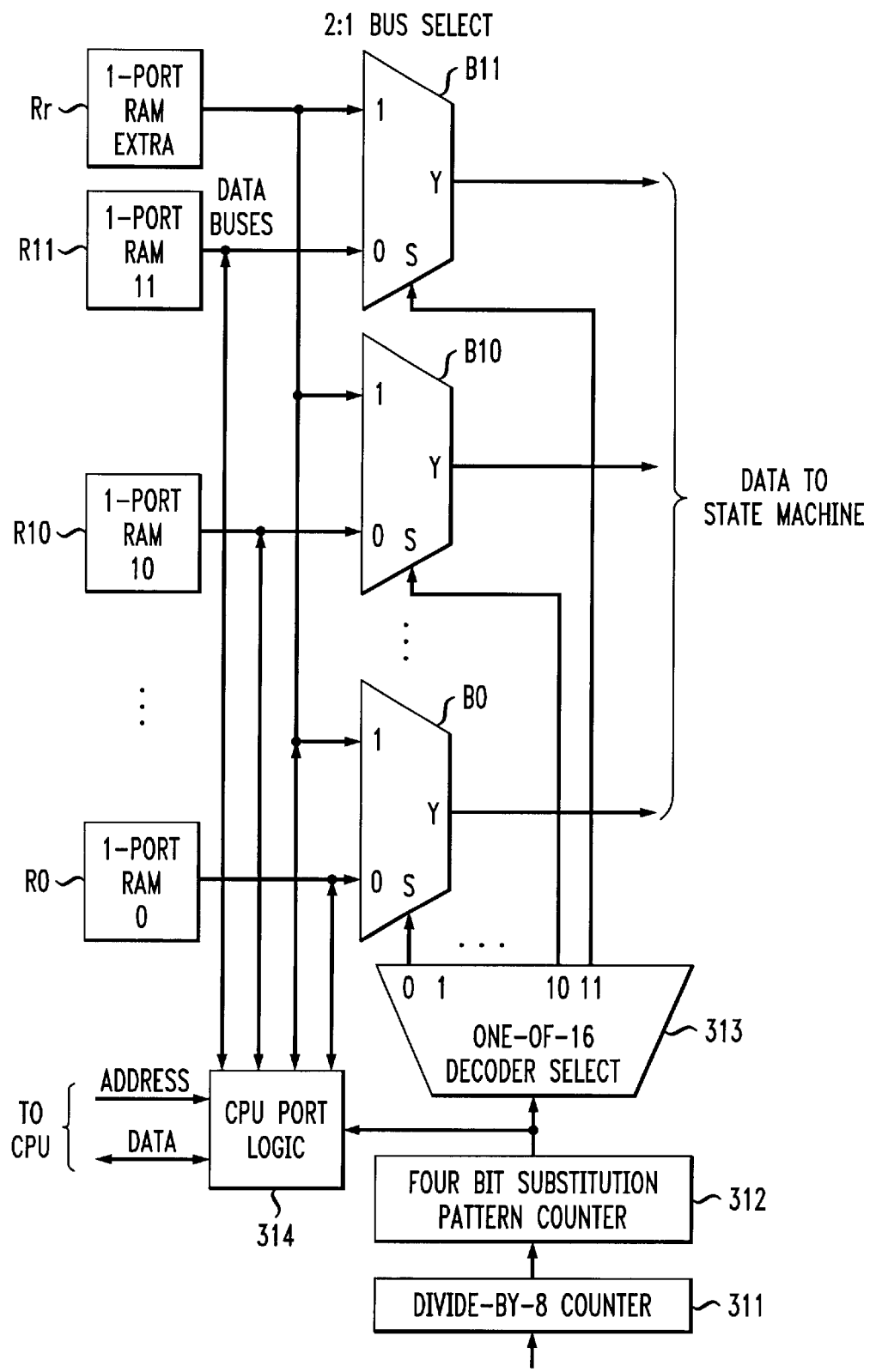
FIG. 5 illustrates a typical circuit that implements the relief pattern generation and memory access control circuitry for the present relief module equipped random access memory.

The above-described relief pattern can be implemented using the circuitry illustrated in FIG. 5. The twelve Random Access Memory modules R0–R11 are illustrated along with the relief Random Access Memory module Rr. Each of the twelve Random Access Memory modules R0–R11 are connected to one input of a corresponding 2:1 bus select circuit B0–B11, with the relief Random Access Memory module Rr being connected to the other input terminal of all of the 2:1 bus select circuits B0–B11. The 2:1 bus select circuits B0–B11 are successively enabled by the timing circuit which comprises a divide-by-eight counter 311 which takes the input clock signals and produces an output signal after receipt of eight clock cycles. This creates the basic eight clock cycle described above, which eight clock cycle interval is used to drive a four-bit pattern counter 312 to create the 16 time intervals ($2^4$) needed to create the 128 clock cycle repeating pattern. The output of the four-bit pattern counter 312 drives a one-of-sixteen decoder 313 to sequentially enable the twelve 2:1 bus select circuits B0–B11. The four-bit pattern counter 312 also drives the CPU port logic 314 which enables the Central Processing Unit 301 to access the presently selected Random Access Memory module. This circuitry renders the hardware configuration of twelve Random Access Memory modules R0–R11 with the associated relief Random Access Memory module Rr transparent to the software that executes on the Central Processing Unit 301. This is due to the fact that both the Central Processing Unit 301 and the State Machine 302 perform the same memory address substitutions so the memory accesses are synchronized with respect to the physical memory addresses.

SUMMARY

The relief module equipped random access memory adds a single-port Random Access Memory module to the plurality of Random Access Memory modules that are typically specified for a particular application. The extra Random Access Memory module alternates its output with each of the others of the plurality of Random Access Memory modules, on a sequential basis, thereby providing effectively extra clock cycles for each Random Access Memory module.

What is claimed:

1. A relief module equipped random access memory connected to a state machine and a central processing unit for enabling both said state machine and said central processing unit to access memory modules in said relief module equipped random access memory, comprising:
   a plurality of random access memory modules;
   a relief random access memory module; and
   memory module interconnection means for sequentially alternating an output of said relief random access memory module with an output of each of said plurality of random access memory modules on a sequential basis to enable both said state machine and said central processing unit to access said random access memory modules and said relief random access memory module.

2. The relief module equipped random access memory of claim 1 wherein said memory module interconnection means comprises:
   means for selecting a one of said plurality of random access memory modules;
   means for enabling said central processing unit to access said selected one of said plurality of random access memory modules; and
   means for interconnecting said relief random access memory module to said state machine in place of said selected one of said plurality of random access memory modules.

3. The relief module equipped random access memory of claim 2 wherein said memory module interconnection means further comprises:
   means, responsive to receipt of a clock signal, for generating a periodic memory select signal; and
   wherein said means for selecting is responsive to receipt of said periodic memory select signal for selecting a next successive one of said plurality of random access memory modules.

4. The relief module equipped random access memory of claim 3 wherein said means for selecting is responsive to receipt of said periodic memory select signal and having last selected a last of said plurality of random access memory modules, for selecting said relief random access memory module.

5. A relief module equipped random access memory connected to a state machine and a central processing unit for enabling both said state machine and said central processing unit to access memory modules in said relief module equipped random access memory, comprising:
   a plurality of random access memory modules;
   a relief random access memory module;
   means for selecting a one of said plurality of random access memory modules and said relief random access memory module in a predetermined order;
   means, responsive to said means for selecting, for enabling said central processing unit to access said selected one of said plurality of random access memory modules and said relief random access memory module; and
   means, responsive to said means for selecting, for interconnecting the remaining ones of said plurality of random access memory modules and said relief random access memory module to said state machine.

6. The relief module equipped random access memory of claim 5 wherein said memory module interconnection means further comprises:
   means, responsive to receipt of a clock signal, for generating a periodic memory select signal; and
   wherein said means for selecting is responsive to receipt of said periodic memory select signal for selecting a next successive one of said plurality of random access memory modules and said relief random access memory module.

* * * * *